United States Patent
Brophy et al.

(10) Patent No.: US 6,654,175 B2
(45) Date of Patent: Nov. 25, 2003

(54) INTEGRATED LED/PHOTODIODE COLLIMATOR ARRAY

(75) Inventors: Christopher P. Brophy, Corning, NY (US); Marc G. Brun, Avon (FR); Mark F. Krol, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/099,281

(22) Filed: Mar. 15, 2002

(65) Prior Publication Data

US 2003/0075722 A1 Apr. 24, 2003

Related U.S. Application Data

(60) Provisional application No. 60/276,321, filed on Mar. 16, 2001.

(51) Int. Cl.[7] .......................... G02B 27/10; G02B 6/38; H04J 14/02
(52) U.S. Cl. .................. 359/620; 359/626; 385/74; 398/88
(58) Field of Search ................ 250/227.22; 359/620, 359/621, 622, 626; 385/74; 398/88

(56) References Cited

U.S. PATENT DOCUMENTS

| | | | | |
|---|---|---|---|---|
| 5,500,869 A | * | 3/1996 | Yoshida et al. | 372/50 |
| 5,650,612 A | | 7/1997 | Criswell et al. | 250/226 |
| 6,536,957 B1 | * | 3/2003 | Buchter | 358/89 |
| 6,587,618 B2 | * | 7/2003 | Raguin et al. | 385/33 |
| 2002/0141062 A1 | * | 10/2002 | Christoffersen et al. | 359/566 |
| 2002/0167485 A1 | * | 11/2002 | Hedrick | 345/156 |
| 2003/0075722 A1 | * | 4/2003 | Brophy et al. | 257/98 |

FOREIGN PATENT DOCUMENTS

WO    WO 02/075774 A1 * 9/2002    ........... H01J/40/41

* cited by examiner

Primary Examiner—David N. Spector
(74) Attorney, Agent, or Firm—Gregory V. Bean

(57) ABSTRACT

The present invention relates to a collimator assembly for use in an optical switch. The collimator assembly includes an integrated LED/photodiode plane disposed in a dual microlens array. The integrated LED/photodiode plane results in a relatively simple way to manufacture high port count collimator arrays with integrated monitoring capabilities. The LED/photodiode plane can be readily produced using standard electronics manufacturing technology.

65 Claims, 2 Drawing Sheets

INTEGRATED LED/PHOTODIODE COLLIMATOR ARRAY

CROSS-REFERENCE TO RELATED APPLICATIONS

This application claims priority under 35 U.S.C. §119(e) based on U.S. Provisional Patent Application Ser. No. 60/276,321, filed Mar. 16, 2001, the contents of which are relied upon and incorporated herein by reference in their entirety.

BACKGROUND OF THE INVENTION

1. Field of the Invention

The present invention relates generally to optical switching, and particularly to monitoring the performance of optical switches.

2. Technical Background

Over the past several decades, fiber optic technology has transformed the telecommunications industry. A decade ago, network designs included relatively low-speed transceiver electronics at each end of a communications link. Light signals were switched by being converted into electrical signals. The electrical signals were switched using electronic switches, and converted back again into light signals. The bandwidth of electronic switching equipment is in the Gigahertz range. On the other hand, the bandwidth of single mode fiber is in the Terahertz range. As the demand for bandwidth increased, network designers have sought ways to exploit the bandwidth in the 1550 nm region. Optically transparent switching fabrics were developed to meet this demand.

In one approach that is being considered, optical designers are evaluating free-space plane-to-plane optical interconnects, often referred to as three-dimensional optical cross-connects (3D OXCs). 3D OXCs have the potential to make large scale N×N switching a reality. For example plane-to-plane interconnects can be designed to easily scale to high port counts on the order of 4000 by 4000 ports. MEMS mirror arrays and conventional collimator arrays can be easily scaled to keep pace with port count growth.

One drawback to this approach relates to the fact that traditional monitoring capability does not scale as favorably. MEMS mirror arrays and collimator arrays can be fabricated using batch processing techniques. However, monitoring components required at each port have to be added later. Per port monitoring is provided by splicing in a light source, light detector, and other associated optical elements at each port in the switch fabric. Thus, the manufacturing process becomes increasingly complicated and costly. Since monitoring components have to be spliced into each port, the amount of fiber that must be managed by the switch is also increased. Both the splicing operations and the increase in the amount of fiber result in reduced switch reliability.

What is needed is an integrated monitoring approach that eliminates the aforementioned problems. A scalable monitoring approach that employs batch processing techniques is needed to reduce costs, simplify the manufacturing process, reduce the amount of fiber employed in the switch, and increase switch reliability.

SUMMARY OF THE INVENTION

The present invention addresses the needs described above. The present invention provides a scalable monitoring approach that reduces costs, simplifies the manufacturing process, reduces the amount of fiber employed in the switch, and increases switch reliability.

One aspect of the present invention is a collimator assembly that includes a first microlens array and a second microlens array. The first microlens array includes at least one first microlens element. The second microlens array includes at least one second microlens element. A monitor transceiver array is disposed between the first microlens array and the second microlens array, the monitor transceiver array including at least one monitor transceiver element coupled to the at least one first microlens element and to the at least one second microlens element.

In another aspect, the present invention includes a method of making a collimator assembly. The method includes providing a first microlens array, the first microlens array including at least one first microlens element. A second microlens array is provided, the second microlens array including at least one second microlens element. A monitor transceiver array is disposed between the first microlens array and the second microlens array. The monitor transceiver array includes at least one monitor transceiver element. The at least one monitor transceiver element is coupled to the at least one first microlens element and to the at least one second microlens element.

In another aspect, the present invention includes a three-dimensional optical switch. The optical switch includes a first collimator array that includes a first monitor transceiver array disposed between a first pigtailed microlens array and a first free-space microlens array. The first pigtailed microlens array has at least one first pigtailed array element. The first monitor transceiver array includes at least one first monitor transceiver element optically coupled to the at least one first pigtailed array element. The first free-space microlens array includes at least one first free-space microlens element optically coupled to the at least one first monitor transceiver element. A beam steering apparatus is coupled to the first collimator array. A second collimator array is coupled to the beam steering apparatus. The second collimator array includes a second monitor transceiver array disposed between a second pigtailed microlens array and a second free-space microlens array. The second pigtailed microlens array has at least one second pigtailed array element. The second monitor transceiver array includes at least one second monitor transceiver element optically coupled to the at least one second pigtailed array element. The second free-space microlens array includes at least one second free-space microlens element optically coupled to the at least one second monitor transceiver element.

In another aspect, the present invention includes a method for monitoring the performance of an optical switch. The optical switch includes a first collimator array having at least one first port array element, and a second collimator array element having at least one second port array element. The method includes directing the at least one light signal into the optical switch via the at least one first port array element. At least one transmission path monitoring signal is superimposed onto the at least one light signal to thereby form at least one superimposed signal. The at least one transmission path monitoring signal is generated by the at least one first port array element. The superimposed signal is directed to the at least one second port array element. The at least one transmission path monitoring signal is received by the at least one second port array element, and the at least one light signal being directed out of the optical switch via the at least one second port array element.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 1:
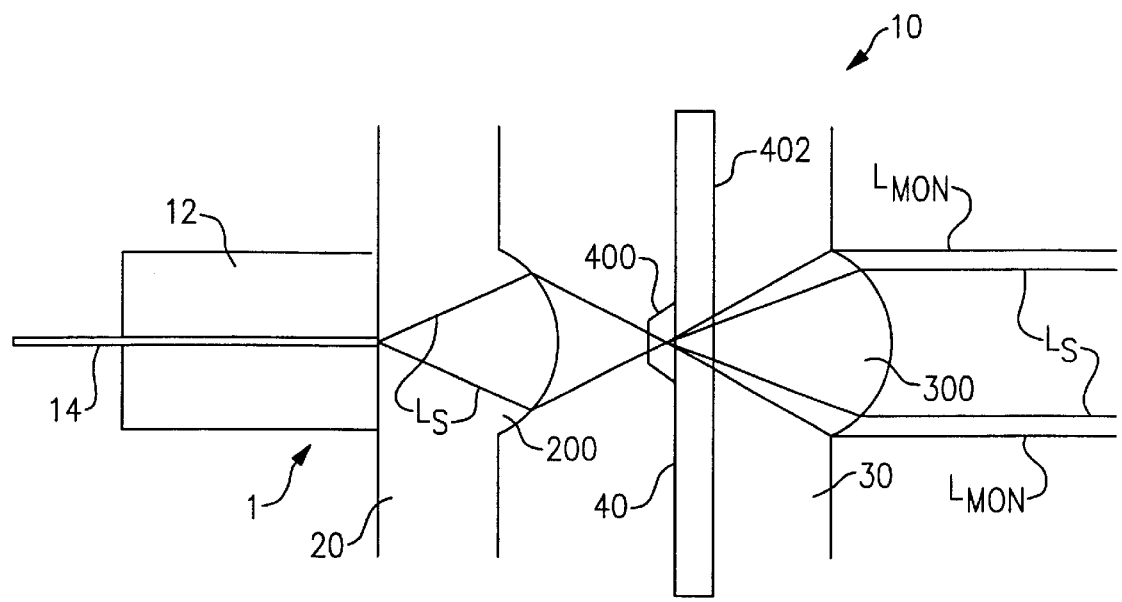
FIG. 1 is a side elevation view of the collimator in accordance with the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the collimator assembly of the present invention is shown in FIG. 1, and is designated generally throughout by reference numeral 10.

In accordance with the invention, the present invention for a collimator assembly for use in an optical switch includes a first microlens array. The first microlens array includes at least one first microlens element. The collimator assembly also includes a second microlens array. The second microlens array includes at least one second microlens element. A monitor transceiver array is disposed between the first microlens array and the second microlens array. The monitor transceiver array includes at least one monitor transceiver element coupled to the at least one first microlens element and to the at least one second microlens element. A relatively simple batch manufacturing process is used to provide the optical switch of the present invention with monitoring capabilities. Thus, the present invention provides a reliable, cost effective optical switch having integrated monitoring capabilities.

As embodied herein and depicted in FIG. 1, a side elevation view of collimator assembly 10 in accordance with the present invention is disclosed. Collimator assembly 10 includes pigtailed microlens array 20. Although only one microlens 200 is shown in FIG. 1, pigtailed microlens array 20 includes a plurality of microlens elements 200. Each microlens 200 is connected to ferrule 12. Ferrule 12 couples optical fiber pigtail 14 to microlens 200. Collimator assembly 10 also includes free-space microlens array 30. In one embodiment, free-space microlens array 30 is optically coupled to a free-space beam steering apparatus (not shown) in an optical switch. Although only one is shown in FIG. 1, microlens array 30 includes a plurality of microlens elements 300. Monitor transceiver array 40 is attached to free-space microlens array 30. Again, although only one transceiver element 400 is shown in FIG. 1, transceiver array 40 includes a plurality of transceiver elements 400 disposed on substrate 402. Each microlens 200 is optically coupled to transceiver element 400. Likewise, each microlens 300 is optically coupled to transceiver element 400. Thus, each port 1 in collimator assembly 10, includes ferrulized optical fiber pigtail 14, microlens 200, transceiver element 400, and microlens 300.

Both pigtailed microlens array 20 and free-space microlens array 30 can be fabricated using conventional collimator array techniques.

It will be apparent to those of ordinary skill in the pertinent art that modifications and variations can be made to transceiver array 40 of the present invention depending on the type of batch processing used to fabricate array 40. For example, transceiver array 40 may be an LED/photodiode array manufactured using standard batch electronics processing techniques. A variety of semiconductor materials can be used in the fabrication of the LED/photodiode arrays. For example, in one embodiment, GaAsP materials are used to fabricate red LEDs and lasers. Si materials are used to fabricate visible and very near-IR photodiodes. In another embodiment, GaAs materials are used to fabricate 850 nm LEDs, lasers, and photodiodes. One very important requirement is that substrate 402 material and active 400 material be transparent to conventional-band (1500–1600 nm) light signals. All of the above materials meet this transparency requirement. In another embodiment, the LEDs are coated with an anti-reflection material for high transmission of the light signal. In yet another embodiment, the LEDs are positioned slightly out of focus to minimize return loss. The embodiment easiest to implement employs GaAsP or GaAs based LEDs and Si photodiodes.

In another embodiment, transceiver elements 400 are implemented by fabricating a single diode structure that is operated as either an LED or a photodiode depending on the polarity of the bias voltage applied to the diode structure. The diode structure is forward biased for use as an LED and reversed biased for use as a photodiode. The ability to change transceiver 400 operation between light emitter and light detector is advantageous during both manufacturing and operation because it allows the light signal path alignment to be optimal for both signal transmission directions (e.g., port 1 is typically employed as both an input port and as an output port).

Figure 2:
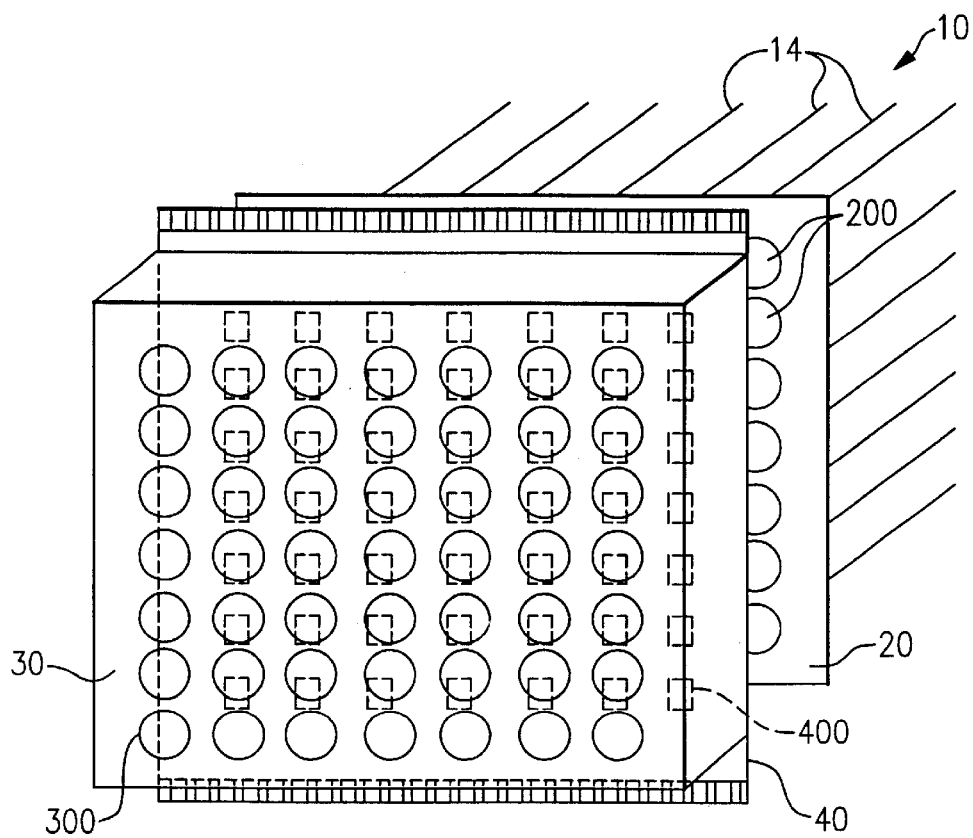
FIG. 2 is a perspective view of the collimator in accordance with the present invention.

As embodied herein and depicted in FIG. 2, a perspective view of the collimator in accordance with the present invention is disclosed. In FIG. 2, collimator array 10 is depicted as a seven by seven collimator array. Assembly of collimator array 10 requires the alignment of four planes of components. First, ferrulized optical fiber pigtails 14 are connected to microlens array 20. Second, transceiver array 40 is aligned and attached to microlens array 30. Finally, pigtailed microlens array 20 is aligned and coupled to the microlens array/transceiver array subassembly. On a per port basis, the above described method causes each ferrulized optical fiber pigtail 14 to be aligned and coupled to a corresponding microlens 200. Each transceiver element 400 is aligned and coupled to a corresponding microlens 300. Finally, each pigtailed microlens 200 is aligned and coupled to a corresponding transceiver equipped microlens 300 in collimator assembly 10.

Figure 3:
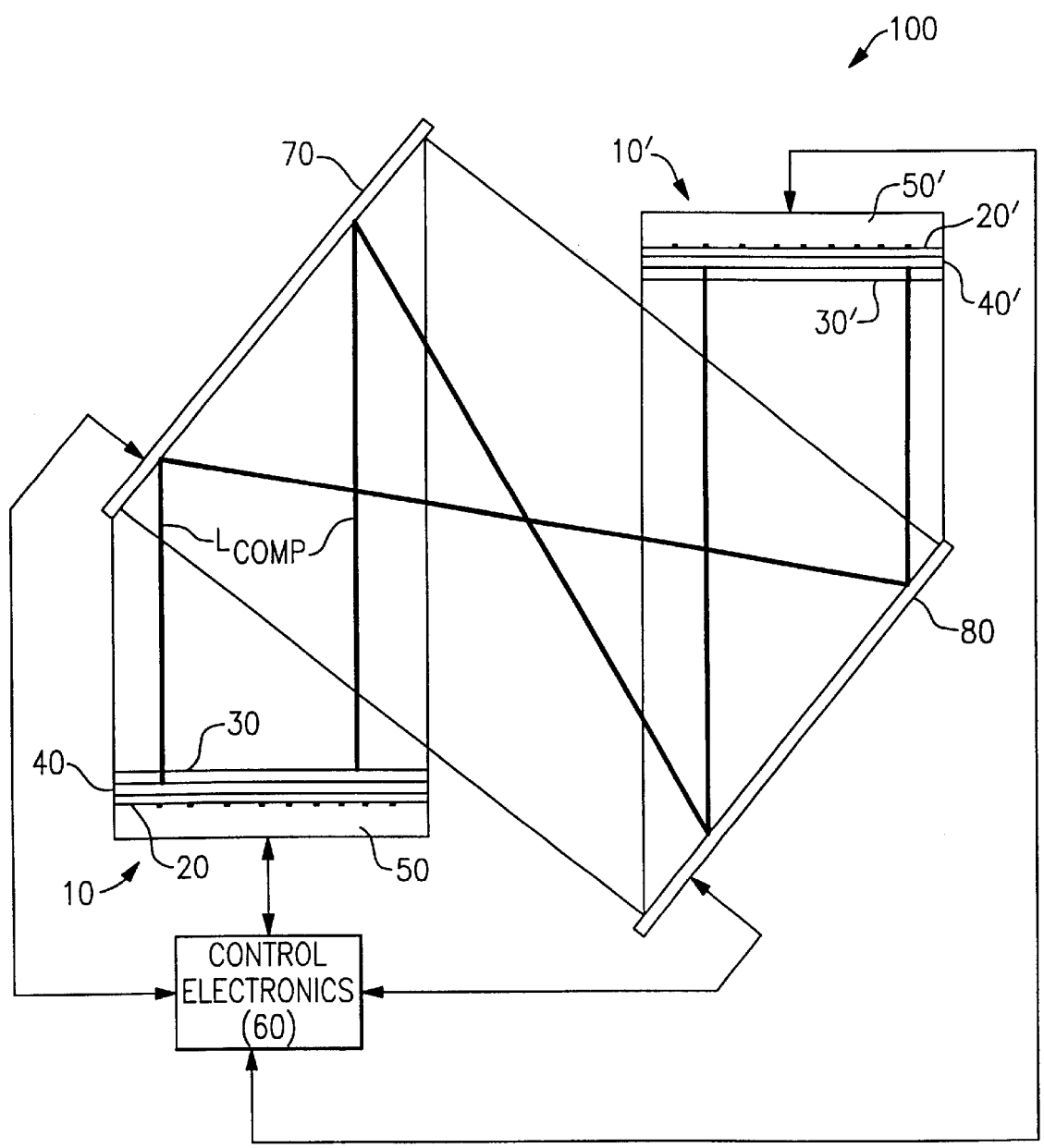
FIG. 3 is a diagrammatic depiction of the optical switch in accordance with the present invention.

As embodied herein and depicted in FIG. 3, a diagrammatic depiction of the optical switch 100 in accordance with the present invention is disclosed. Optical switch 100 includes collimator array 10 coupled to integrated beam steering array 70. Beam steering array 70 is optically coupled to beam steering array 80. Beam steering array 80 is coupled to collimator array 10'. Those of ordinary skill in the art will recognize that collimator array 10' is identical to collimator array 10 described above. Optical switch 100 also includes control electronics module 60. Control module 60 provides beam steering array 70 and beam steering array 80 with beam steering commands. Control module 60 also processes all of the electrical monitor signals received from each transceiver element 400. The electrical monitor signals are used as feedback, allowing control module 60 to adjust the position of individual beam steering pixels disposed on either array 70 or array 80. The electrical monitor signals are also used to evaluate the performance of each transmission path in optical switch 100.

It will be apparent to those of ordinary skill in the pertinent art that modifications and variations can be made to control system 60 of the present invention depending on the size and overall capacity of optical switch 100. For example, control system 60 may include a 32-bit microprocessor, a RISC processor, or an application specific integrated chip (ASIC). The ASIC may be implemented using a programmable logic array (PLA) device, or by a field programmable gate array (FPGA) device. In another embodiment, control system 60 is implemented using computing resources disposed in the network.

Beam steering array 70 includes a number of steerable pixels corresponding to the number of ports 15 included in collimator assembly 10. Likewise, beam steering array 80 includes a number of steerable pixels corresponding to the number of ports 15' included in collimator assembly 10'. In one embodiment, the beam steering arrays include gimbaled reflective pixels that are steerable with 2-degrees of freedom. The reflective pixels are actuated by electrostatic actuators. The electrostatic actuators are coupled to control system 60 via a control bus.

Referring to FIG. 1 and FIG. 3, the integrated monitoring functionality in collimator array 10 operates as follows. When light signal Ls is directed into the collimator array via ferrulized fiber pigtail 14, control electronics 60 activates the LED function in transceiver element 400. Thus, in the LED/photodiode embodiment, the LED is activated In the single diode structure embodiment, a forward bias is applied to the diode to cause the diode to function as an LED. Subsequently, the LED element transmits monitor light signal Lmon that is superimposed onto the information carrying light signal Ls. The composite signal Lcomp is directed from microlens 300 to beam steering array 70. On the other hand, if the composite light signal Lcomp is directed from the beam steering array 70 into microlens 300, control electronics 60 activates the photodiode functionality in transceiver element 400. Thus, in the LED/photodiode embodiment, the photodiode is activated In the single diode structure embodiment, a reverse bias is applied to the diode to cause it to function as a photodiode. Consequently, monitor signal Lmon is converted into an electrical monitor signal by the photodiode. Information carrying signal Ls passes through transceiver substrate 402 and transceiver element 400 and is directed into microlens 200. Finally, light signal Ls exits the collimator array via ferrulized optical fiber pigtail 14. Obviously, the above description applies equally to collimator array 10'.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A collimator assembly comprising:
   a first microlens array, the first microlens array including at least one first microlens element;
   a second microlens array, the second microlens array including at least one second microlens element; and
   a monitor transceiver array disposed between the first microlens array and the second microlens array, the monitor transceiver array including at least one monitor transceiver element coupled to the at least one first microlens element and to the at least one second microlens element.

2. The assembly of claim 1, wherein the at least one first microlens element is also coupled to an optical fiber pigtail.

3. The assembly of claim 1, wherein the at least one monitor transceiver element includes an LED transmitter and a photodiode receiver.

4. The assembly of claim 3, wherein the LED transmitter includes an anti-reflective coating.

5. The assembly of claim 3, wherein the LED is a GaAsP LED.

6. The assembly of claim 3, wherein the LED is a GaAs LED.

7. The assembly of claim 3, wherein the photodiode is a GaAs photodiode.

8. The assembly of claim 3, wherein the photodiode is a silicon photodiode.

9. The assembly of claim 1, wherein the at least one monitor transceiver element is comprised of a diode structure, the diode structure functioning as an LED when a first bias voltage is applied to the diode structure, the diode structure functioning as a photodiode when a second bias voltage is applied to the diode structure.

10. The assembly of claim 9, wherein the diode structure functions as an LED when the diode structure is forward biased.

11. The assembly of claim 9, wherein the diode structure functions as a photodiode when the diode structure is reverse biased.

12. The assembly of claim 1, further comprising a control module coupled to the monitor transceiver array.

13. The assembly of claim 12, wherein the control module activates the at least one monitor transceiver element when a light signal is directed into the optical switch via the at least one first microlens element, the at least one monitor transceiver element transmitting a monitor signal that is superimposed onto the light signal to thereby form a composite signal that is directed out of the assembly by the at least one second microlens element.

14. The assembly of claim 12, wherein the control module activates the at least one monitor transceiver element when a composite light signal is directed by the optical switch into the at least one second microlens element, the composite light signal including a monitor signal superimposed onto a light signal, the at least one monitor transceiver element receiving the monitor signal, and the light signal being directed out of the optical switch by the at least one first microlens element.

15. The assembly of claim 1, wherein the at least one monitor transceiver element transmits a monitor signal when a light signal is directed into the optical switch via the at least one first microlens element, the monitor signal being superimposed onto the light signal to thereby form a composite signal that is directed out of the collimator assembly by the at least one second microlens element.

16. The assembly of claim 1, wherein the at least one monitor transceiver element receives a monitor signal when a composite light signal is directed by the optical switch into the at least one second microlens element, the composite light signal including the monitor signal superimposed onto a light signal, and the light signal being directed out of the optical switch by the at least one first microlens element.

17. The assembly of claim 1, wherein the at least one first microlens element includes a plurality of first microlens elements, the at least one second microlens element includes a plurality of second microlens elements and the at least one monitor transceiver element includes a plurality of monitor transceiver elements, each of the plurality of monitor transceiver elements are coupled to a corresponding first microlens element and a corresponding second microlens element.

18. The assembly of claim 17, wherein each of the plurality of monitor transceiver elements transmits at a different wavelength.

19. A method of making a collimator assembly, the method comprising:
providing a first microlens array, the first microlens array including at least one first microlens element;
providing a second microlens array, the second microlens array including at least one second microlens element; and
disposing a monitor transceiver array between the first microlens array and the second microlens array, the monitor transceiver array including at least one monitor transceiver element coupled to the at least one first microlens element and to the at least one second microlens element.

20. The method of claim 19, wherein the step of providing a first microlens array includes the step of coupling at least one ferrulized optical fiber to the at least one first microlens element.

21. The method of claim 19, wherein the step of disposing a monitor transceiver array further comprises the steps of:
coupling the monitor array to the second microlens array to form a sub-assembly; and aligning the first microlens array to the sub-assembly.

22. The method of claim 19, further comprising:
providing at least one pigtailed fiber ferrule;
connecting the at least one first microlens element to the at least one pigtailed fiber ferrule to form a pigtailed first microlens array;
attaching the monitor array to the second microlens array to form a sub-assembly, wherein the at least one second microlens element is substantially aligned to the at least one monitor transceiver element; and
coupling the pigtailed first microlens array to the sub-assembly, whereby the at least one first microlens element is substantially aligned to the at least one monitor transceiver element.

23. The method of claim 22, wherein the at least one first microlens element includes a plurality of first microlens elements, the at least one pigtailed fiber ferrule includes a plurality of pigtailed fiber ferrules, the at least one second microlens element includes a plurality of second microlens elements, and the at least one monitor transceiver element includes a plurality of monitor transceiver elements.

24. The method of claim 19, wherein the at least one monitor transceiver element includes an LED transmitter and a photodiode receiver.

25. The method of claim 24, wherein the LED transmitter includes an anti-reflective coating.

26. The method of claim 24, wherein the LED is a GaAsP LED.

27. The method of claim 24, wherein the LED is a GaAs LED.

28. The method of claim 24, wherein the photodiode is a GaAs photodiode.

29. The method of claim 24, wherein the photodiode is a silicon photodiode.

30. The method of claim 19, wherein the at least one monitor transceiver element is comprised of a diode structure, the diode structure functioning as an LED when a first bias voltage is applied to the diode structure, the diode structure functioning as a photodiode when a second bias voltage is applied to the diode structure.

31. The method of claim 30, wherein the diode structure functions as an LED when the diode structure is forward biased.

32. The method of claim 30, wherein the diode structure functions as a photodiode when the diode structure is reverse biased.

33. The method of claim 19, further comprising a control module coupled to the monitor transceiver array.

34. The method of claim 33, wherein the control module is configured to activate the at least one monitor transceiver element when a light signal is directed into the optical switch via the at least one first microlens element, the at least one monitor transceiver element transmitting a monitor signal that is superimposed onto the light signal to thereby form a composite signal that is directed out of the assembly by the at least one second microlens element.

35. The method of claim 33, wherein the control module is configured to activate the at least one monitor transceiver element when a composite light signal is directed by the optical switch into the at least one second microlens element, the composite light signal including a monitor signal superimposed onto a light signal, the at least one monitor transceiver element receiving the monitor signal, and the light signal being directed out of the optical switch by the at least one first microlens element.

36. The method of claim 33, wherein the at least one monitor transceiver element is configured to transmit a monitor signal when a light signal is directed into the optical switch via the at least one first microlens element, the monitor signal being superimposed onto the light signal to thereby form a composite signal that is directed out of the collimator assembly by the at least one second microlens element.

37. A three-dimensional optical switch, the optical switch comprising:
a first collimator array including a first monitor transceiver array disposed between a first pigtailed microlens array and a first free-space microlens array, the first pigtailed microlens array having at least one first pigtailed array element, the first monitor transceiver array including at least one first monitor transceiver element optically coupled to the at least one first pigtailed array element, and the first free-space microlens array including at least one first free-space microlens element optically coupled to the at least one first monitor transceiver element;
a beam steering apparatus coupled to the first collimator array; and
a second collimator array coupled to the beam steering apparatus, the second collimator array including a second monitor transceiver array disposed between a second pigtailed microlens array and a second free-space microlens array, the second pigtailed microlens array having at least one second pigtailed array element, the second monitor transceiver array including at least one second monitor transceiver element optically coupled to the at least one second pigtailed array element, and the second free-space microlens array including at least one second free-space microlens element optically coupled to the at least one second monitor transceiver element.

38. The optical switch of claim 37, wherein the beam steering apparatus further comprises:
a first integrated beam steering array coupled to the first collimator array, the first integrated beam steering array including at least one first beam steering device; and
a second integrated beam steering array coupled to the first integrated beam steering array and the second collimator array, the second integrated beam steering array including at least one second beam steering device.

39. The optical switch of claim 37, wherein at least one composite optical signal is propagated between the first collimator array and the second collimator array via the beam steering apparatus, the at least one composite optical signal includes at least one traffic light signal and at least one monitor signal.

40. The optical switch of claim 39, wherein the at least one composite optical signal includes a plurality of composite optical signals.

41. The optical switch of claim 37, wherein the at least one first pigtailed array element includes a plurality of first pigtailed array elements, the at least one first monitor transceiver element including a plurality of first monitor transceiver elements, and the at least one first free-space microlens element including a plurality of first free-space microlens elements.

42. The optical switch of claim 37, wherein the at least one second pigtailed array element includes a plurality of second pigtailed array elements, the at least one second monitor transceiver element including a plurality of second monitor transceiver elements, and the at least one second free-space microlens element including a plurality of second free-space microlens elements.

43. The optical switch of claim 37, wherein the at least one first monitor transceiver element transmits a monitor signal when a traffic light signal is directed into the optical switch via the at least one first pigtailed microlens element, the monitor signal being superimposed onto the light signal to thereby form a composite signal that is directed out of the first collimator array by the at least one first free-space microlens element.

44. The optical switch of claim 37, wherein the at least one first monitor transceiver element receives a monitor signal when a composite light signal is directed by the optical switch into the at least one first free-space microlens element, the composite light signal including the monitor signal superimposed onto a traffic light signal, and the light signal being directed out of the optical switch by the at least one first pigtailed microlens element.

45. The optical switch of claim 37, wherein the at least one second monitor transceiver element transmits a monitor signal when a traffic light signal is directed into the optical switch via the at least one second pigtailed microlens element, the monitor signal being superimposed onto the light signal to thereby form a composite signal that is directed out of the second collimator array by the at least one second free-space microlens element.

46. The optical switch of claim 37, wherein the at least one second monitor transceiver element receives a monitor signal when a composite light signal is directed by the optical switch into the at least one second free-space microlens element, the composite light signal including the monitor signal superimposed onto a traffic light signal, and the light signal being directed out of the optical switch by the at least one second pigtailed microlens element.

47. The optical switch of claim 37 further comprising a control module coupled to the first collimator array, the beam steering apparatus, and the second collimator array.

48. The optical switch of claim 47, wherein the beam steering apparatus further comprises:
a first integrated beam steering array coupled to the first collimator array, the first integrated beam steering array including a plurality of first array beam steering devices, the plurality of first array beam steering devices being individually controllable by the control module; and
a second integrated beam steering array coupled to the first integrated beam steering array and the second collimator array, the second integrated beam steering array including a plurality of second beam steering devices, the plurality of second array beam steering devices being individually controllable by the control module.

49. The optical switch of claim 47, wherein the control module activates the at least one first monitor transceiver element when a light signal is directed into the optical switch via the at least one first pigtailed microlens element, the at least one monitor transceiver element transmitting a monitor signal that is superimposed onto the light signal to thereby form a composite signal that is directed toward the beam steering apparatus by the at least one first free-space microlens element.

50. The optical switch of claim 49, wherein the beam steering apparatus directs the composite signal into the at least one second free-space microlens element.

51. The optical switch of claim 50, wherein the control module activates the at least one second monitor transceiver element when a composite light signal is directed by the beam steering apparatus into the at least one second free-space microlens element, the composite light signal including at least one monitor signal superimposed onto at least one light signal, the at least one second monitor transceiver element receiving the at least one monitor signal to thereby generate at least one electrical monitor signal, and the at least one light signal being directed out of the optical switch by the at least one second pigtailed microlens element.

52. The optical switch of claim 51, wherein the control module includes a feed-back loop that processes the at least one electrical monitor signal to adjust the beam steering apparatus.

53. The optical switch of claim 47, wherein the control module activates the at least one second monitor transceiver element when a light signal is directed into the optical switch via the at least one second pigtailed microlens element, the at least one second monitor transceiver element transmitting a monitor signal that is superimposed onto the light signal to thereby form a composite signal that is directed toward the beam steering apparatus by the at least one second free-space microlens element.

54. The optical switch of claim 53, wherein the beam steering apparatus directs the composite signal into the at least one first free-space microlens element.

55. The optical switch of claim 54, wherein the control module activates the at least one first monitor transceiver element when a composite light signal is directed by the beam steering apparatus into the at least one first free-space microlens element, the composite light signal including at least one monitor signal superimposed onto at least one light signal, the at least one first monitor transceiver element receiving the at least one monitor signal to thereby generate at least one electrical monitor signal, and the at least one light signal being directed out of the optical switch by the at least one first pigtailed microlens element.

56. The optical switch of claim 55, wherein the control module includes a feed-back loop that processes the at least one electrical monitor signal to adjust the beam steering apparatus.

57. A method for monitoring the performance of an optical switch, the optical switch including a first collimator array having at least one first port array element, and a second collimator array element having at least one second port array element, the method comprising:

directing the at least one light signal into the optical switch via the at least one first port array element;

superimposing at least one transmission path monitoring signal onto the at least one light signal to thereby form at least one superimposed signal, the at least one transmission path monitoring signal being generated by the at least one first port array element; and directing the superimposed signal to the at least one second port array element, the at least one transmission path monitoring signal being received by the at least one second port array element, and the at least one light signal being directed out of the optical switch via the at least one second port array element.

58. The method of claim 57, wherein the at least one first port array element includes at least one first pigtailed array element, at least one first monitor transceiver element, and at least one first free-space microlens element.

59. The method of claim 58, wherein the at least one first pigtailed array element includes a plurality of first pigtailed array elements, the at least one first monitor transceiver element including a plurality of first monitor transceiver elements, and the at least one first free-space microlens element including a plurality of first free-space microlens elements.

60. The method of claim 58, wherein the at least one first monitor transceiver element transmits a monitor signal when a traffic light signal is directed into the optical switch via the at least one first pigtailed microlens element, the monitor signal being superimposed onto the light signal to thereby form a composite signal that is directed out of the first collimator array by the at least one first free-space microlens element.

61. The method of claim 58, wherein the at least one first monitor transceiver element receives a monitor signal when a composite light signal is directed by the optical switch into the at least one first free-space microlens element, the composite light signal including the monitor signal superimposed onto a traffic light signal, and the light signal being directed out of the optical switch by the at least one first pigtailed microlens element.

62. The method of claim 57, wherein the at least one second port array element includes at least one second pigtailed array element, at least one second monitor transceiver element, and at least one second free-space microlens element.

63. The method of claim 62, wherein the at least one second pigtailed array element includes a plurality of second pigtailed array elements, the at least one second monitor transceiver element including a plurality of second monitor transceiver elements, and the at least one second free-space microlens element including a plurality of second free-space microlens elements.

64. The method of claim 62, wherein the at least one second monitor transceiver element transmits a monitor signal when a traffic light signal is directed into the optical switch via the at least one second pigtailed microlens element, the monitor signal being superimposed onto the light signal to thereby form a composite signal that is directed out of the second collimator array by the at least one second free-space microlens element.

65. The method of claim 62, wherein the at least one second monitor transceiver element receives a monitor signal when a composite light signal is directed by the optical switch into the at least one second free-space microlens element, the composite light signal including the monitor signal superimposed onto a traffic light signal, and the light signal being directed out of the optical switch by the at least one second pigtailed microlens element.

* * * * *